(12) United States Patent
Pagaila et al.

(10) Patent No.: US 9,224,693 B2
(45) Date of Patent: Dec. 29, 2015

(54) SEMICONDUCTOR DEVICE AND METHOD OF FORMING TMV AND TSV IN WLCSP USING SAME CARRIER (71) Applicant: STATS ChipPAC, Ltd., Singapore (SG)

(72) Inventors: Reza A. Pagaila, Tangerang (ID); Yaojian Lin, Singapore (SG); Seung Wook Yoon, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/326,237

(22) Filed: Jul. 8, 2014

(65) Prior Publication Data
US 2014/0319678 A1 Oct. 30, 2014

Related U.S. Application Data (62) Division of application No. 12/710,995, filed on Feb. 23, 2010, now Pat. No. 8,822,281.

(51) Int. Cl.
*H01L 23/48* (2006.01)
*H01L 23/538* (2006.01)
(Continued)

(52) U.S. Cl.
CPC .......... *H01L 23/5384* (2013.01); *H01L 21/568* (2013.01); *H01L 21/76898* (2013.01); *H01L 23/3128* (2013.01); *H01L 23/481* (2013.01); *H01L 23/49816* (2013.01); *H01L 23/5389* (2013.01); *H01L 24/10* (2013.01); *H01L 24/19* (2013.01); *H01L 24/97* (2013.01); *H01L 25/105* (2013.01); *H01L 24/48* (2013.01); *H01L 2224/04105* (2013.01); *H01L 2224/12105* (2013.01); *H01L 2224/2518* (2013.01); *H01L 2224/48247* (2013.01); *H01L 2224/73265* (2013.01); *H01L 2224/97* (2013.01);
(Continued)

(58) Field of Classification Search
CPC ................ H01L 21/76895; H01L 21/823475; H01L 21/823871
USPC ................... 438/109, 690; 257/686, E21.532, 257/E23.141
See application file for complete search history.

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

CN 1294540 A 5/2001
CN 101162717 A 4/2008

*Primary Examiner* — Elias M Ullah
(74) *Attorney, Agent, or Firm* — Robert D. Atkins; Patent Law Group: Atkins and Associates, P.C.

(57) ABSTRACT

A semiconductor device has a semiconductor die mounted over a carrier. An encapsulant is deposited over the semiconductor die and carrier. An insulating layer is formed over the semiconductor die and encapsulant. A plurality of first vias is formed through the insulating layer and semiconductor die while mounted to the carrier. A plurality of second vias is formed through the insulating layer and encapsulant in the same direction as the first vias while the semiconductor die is mounted to the carrier. An electrically conductive material is deposited in the first vias to form conductive TSV and in the second vias to form conductive TMV. A first interconnect structure is formed over the insulating layer and electrically connected to the TSV and TMV. The carrier is removed. A second interconnect structure is formed over the semiconductor die and encapsulant and electrically connected to the TSV and TMV.

25 Claims, 10 Drawing Sheets (51) Int. Cl.
   *H01L 21/56*       (2006.01)
   *H01L 21/768*      (2006.01)
   *H01L 23/31*       (2006.01)
   *H01L 23/498*      (2006.01)
   *H01L 23/00*       (2006.01)
   *H01L 25/10*       (2006.01)

(52) U.S. Cl.
   CPC . *H01L 2225/1035* (2013.01); *H01L 2225/1041* (2013.01); *H01L 2225/1058* (2013.01); *H01L 2924/01004* (2013.01); *H01L 2924/014* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01046* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/09701* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/19041* (2013.01); *H01L 2924/30105* (2013.01)

(56) References Cited

U.S. PATENT DOCUMENTS

| | | |
|---|---|---|
| 5,841,193 A | 11/1998 | Eichelberger |
| 6,563,079 B1 | 5/2003 | Umetsu et al. |
| 7,618,846 B1 | 11/2009 | Pagaila et al. |
| 7,619,901 B2 | 11/2009 | Eichelberger et al. |
| 2007/0069376 A1 | 3/2007 | Dangelmaier et al. |
| 2008/0083975 A1 | 4/2008 | Chao et al. |
| 2008/0272465 A1 | 11/2008 | Do et al. |
| 2008/0272476 A1 | 11/2008 | Do et al. |
| 2009/0020855 A1 | 1/2009 | Pyeon |
| 2009/0239336 A1 | 9/2009 | Lee et al. |
| 2010/0193928 A1 | 8/2010 | Zudock et al. |
| 2011/0095395 A1 | 4/2011 | Ellul et al. |

SEMICONDUCTOR DEVICE AND METHOD OF FORMING TMV AND TSV IN WLCSP USING SAME CARRIER

CLAIM OF DOMESTIC PRIORITY

The present application is a division of U.S. patent application Ser. No. 12/710,995, now U.S. Pat. No. 8,822,281, filed Feb. 23, 2010, which application is incorporated herein by reference.

FIELD OF THE INVENTION

The present invention relates in general to semiconductor devices and, more particularly, to a semiconductor device and method of forming TMVs and TSVs in a WLCSP in the same direction during the same manufacturing process using the same carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices often require vertical interconnect structures, for example, when stacking devices for efficient integration. The electrical interconnection between semiconductor devices, such as fan-out wafer level chip scale package (FO-WLCSP) containing semiconductor die, on multiple levels and external devices can be accomplished with conductive through silicon vias (TSV), conductive through hole vias (THV), conductive through mold vias (TMV), Cu-plated conductive pillars, and conductive bumps. These vertical interconnect structures are costly and time consuming during the manufacturing process, and susceptible to defects during formation.

In particular, in a WLCSP, the conductive TSV is formed first, prior to singulation while in wafer form, using a first carrier for support. The conductive TMV is formed later in the process, after encapsulation, using a different carrier for support. A build-up interconnect structure is typically formed over the semiconductor die. Additional processing steps are required to form vias in the build-up layers to reroute TSV for interconnection to the upper semiconductor device. After forming TSVs in the semiconductor die, conductive vias must be formed in the passivation layer over the TSVs to electrically connect the TSVs to upper conductive layers. Since the TSV and TMV are formed by separate processes on different carriers, the manufacturing process requires more time, material, and steps, which adds cost and greater risk of introducing defects in the semiconductor device or the entire wafer. For example, since the TSV are formed while in wafer form, the semiconductor wafer is subject to damage.

SUMMARY OF THE INVENTION

A need exists for a simple and cost-effective process to form TSV and TMV in a WLCSP. Accordingly, in one embodiment, the present invention is a semiconductor device comprising a semiconductor die and encapsulant deposited around the semiconductor die. An insulating layer is formed over the semiconductor die. A first conductive via extends through the insulating layer and semiconductor die. A second conductive via is formed through the encapsulant.

In another embodiment, the present invention is a semiconductor device comprising a semiconductor die and first insulating material deposited over and around the semiconductor die. A first conductive via extends through the first insulating material and semiconductor die. A second conductive via is formed through the first insulating material.

In another embodiment, the present invention is a semiconductor device comprising a semiconductor die and first insulating material deposited over and around the semiconductor die. A first interconnect structure is formed over the semiconductor die. A first conductive via extends through the first insulating material, semiconductor die, and first interconnect structure.

In another embodiment, the present invention is a semiconductor device comprising a semiconductor die and first insulating material deposited over and around the semiconductor die. A first conductive via extends through the first insulating material and semiconductor die.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
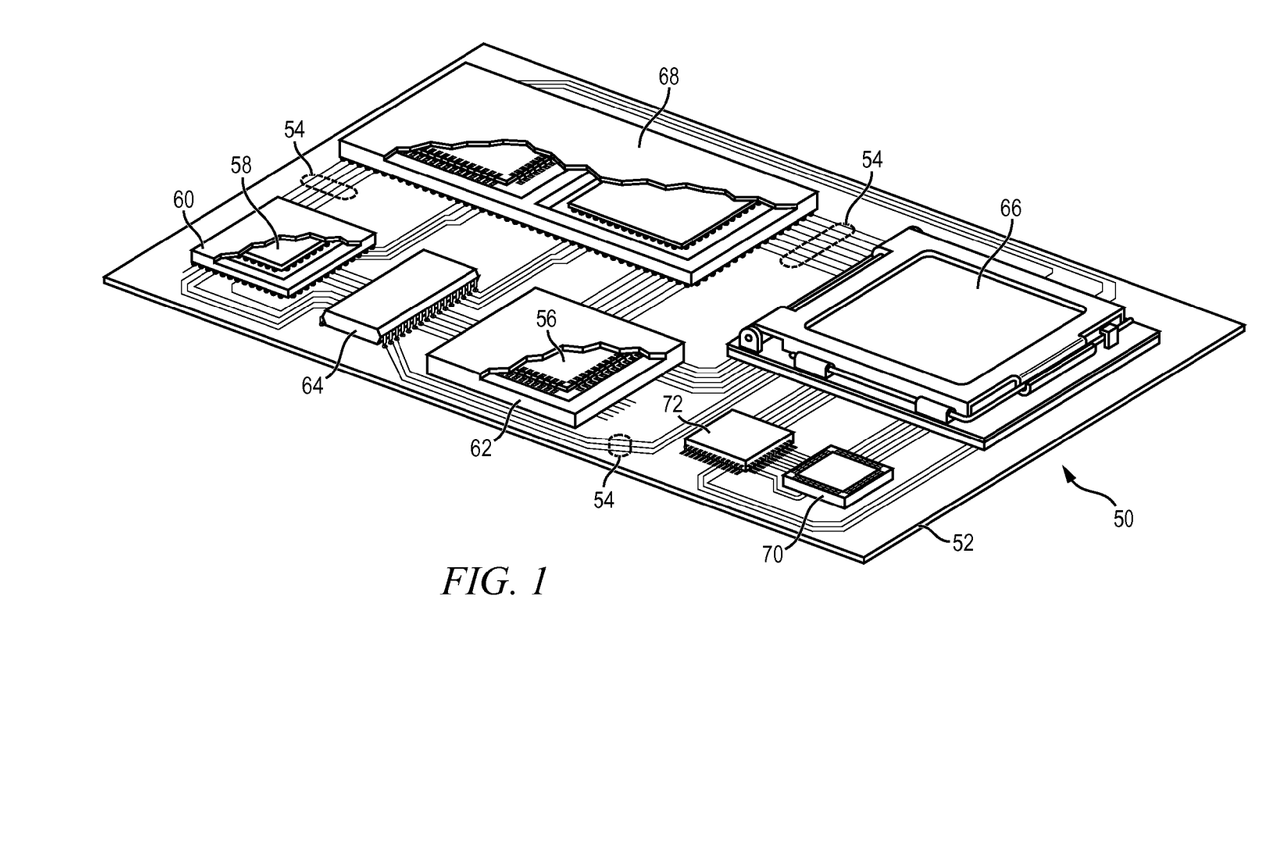
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
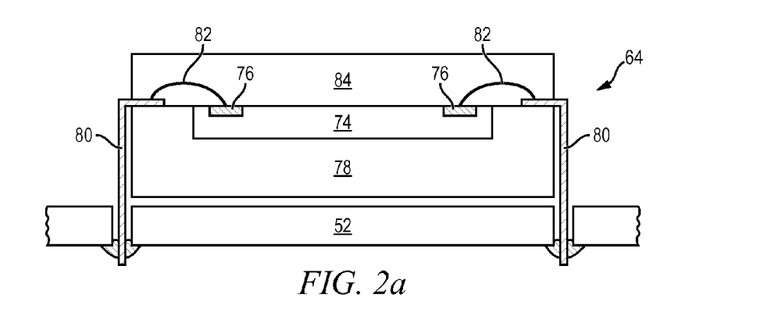
FIGS. 2a-2c illustrate further detail of the semiconductor packages mounted to the PCB.
Figure 2B:
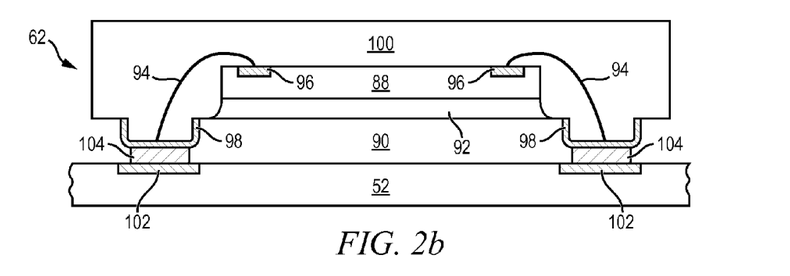
Figure 2C:
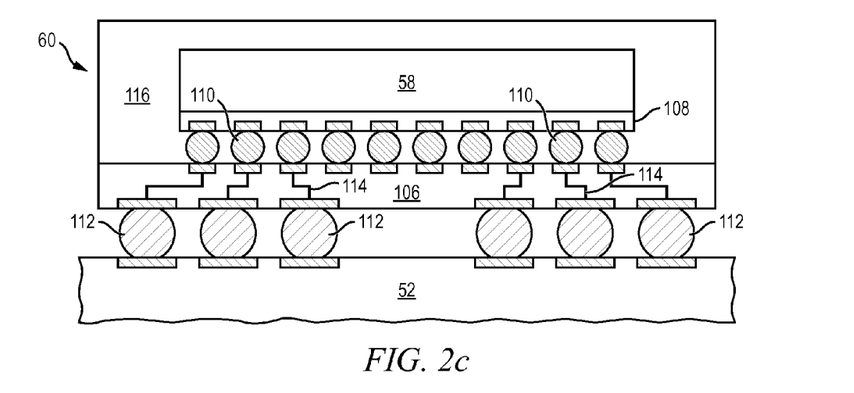

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
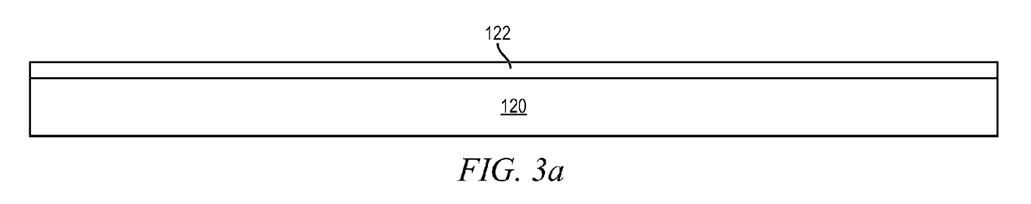
FIGS. 3a-3j illustrate a process of forming TMVs and TSVs in a WLCSP in the same direction during the same manufacturing process using the same carrier.

FIGS. 3a-3j illustrate a process of forming TMVs and TSVs in a WLCSP in the same direction during the same manufacturing process using the same carrier. In FIG. 3a, a sacrificial or temporary substrate or carrier 120 contains base material such as silicon, polymer, polymer composite, metal, ceramic, glass, glass epoxy, beryllium oxide, tape, or other suitable low-cost, rigid material for structural support. An optional interface layer 122 can be formed over carrier 120 as a temporary double-sided adhesive tape or bonding film or etch-stop layer.

Figure 3B:
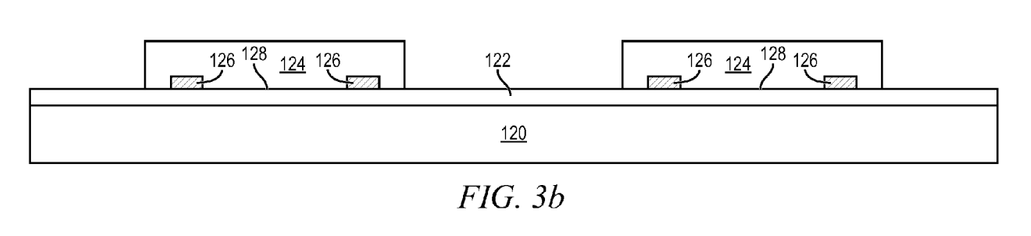

In FIG. 3b, semiconductor die or components 124 are mounted to carrier 120 with contact pads 126 oriented downward over the carrier. Semiconductor die 124 has an active region 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPD, such as inductors, capacitors, and resistors, for RF signal processing. Semiconductor die 124 can be a flipchip type device or wire bond type device. In another embodiment, a discrete component can be mounted over interface layer 122 and carrier 120.

Figure 3C:
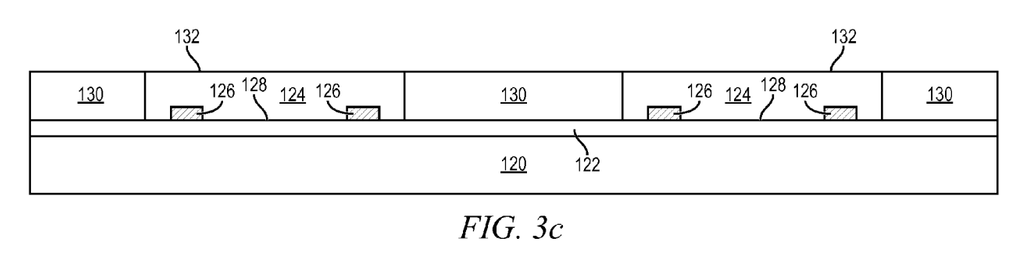

FIG. 3c shows an encapsulant or molding compound 130 deposited over semiconductor die 124 and carrier 120 using a paste printing, compressive molding, transfer molding, liquid encapsulant molding, vacuum lamination, or other suitable applicator. Encapsulant 130 can be polymer composite material, such as epoxy resin with filler, epoxy acrylate with filler, or polymer with proper filler. Encapsulant 130 is non-conductive and environmentally protects the semiconductor device from external elements and contaminants. Encapsulant 130 is planarized to expose back surface 132 of semiconductor die 124, opposite active surface 128.

Figure 3D:
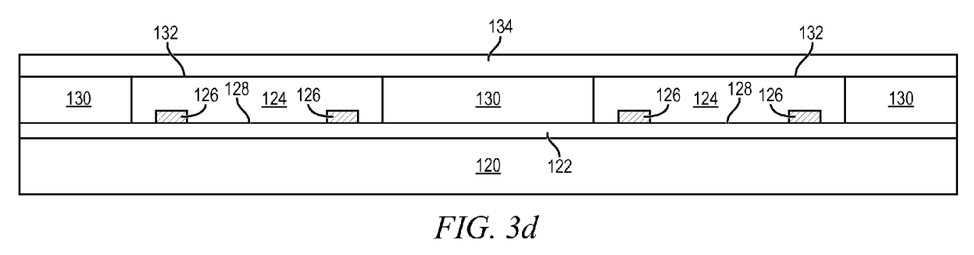

In FIG. 3d, an insulating or passivation layer 134 is formed over back surface 132 of semiconductor die 124 and encapsulant 130 using PVD, CVD, printing, spin coating, spray coating, or thermal oxidation process. The insulating layer 134 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

Figure 3E:
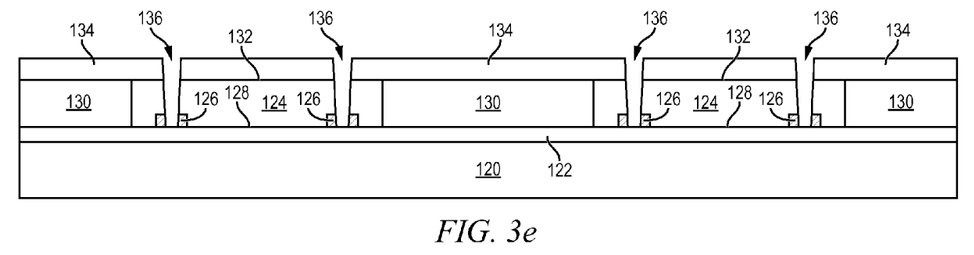

In FIG. 3e, a plurality of vias 136 is formed through insulating layer 134 and semiconductor die 124, while the die is mounted to carrier 120, using laser drilling, mechanical drilling, or deep reactive ion etching (DRIE) process. The vias 136 are formed from insulating layer 134 and backside 132, after depositing encapsulant 130, with active surface 128 of semiconductor die 124 facing down. The vias 136 extend through the silicon region of semiconductor die 124 to contact pads 126. Likewise, in FIG. 3f, a plurality of vias 138 is formed through insulating layer 134 and encapsulant 130, while semiconductor die 124 is mounted to carrier 120, using laser drilling, mechanical drilling, or DRIE. The vias 138 are formed from the same side as vias 136 and extend to interface layer 122. The vias 136 and 138 are formed simultaneously or consecutively from the same side during the same manufacturing process using the same carrier 120.

Figure 3F:
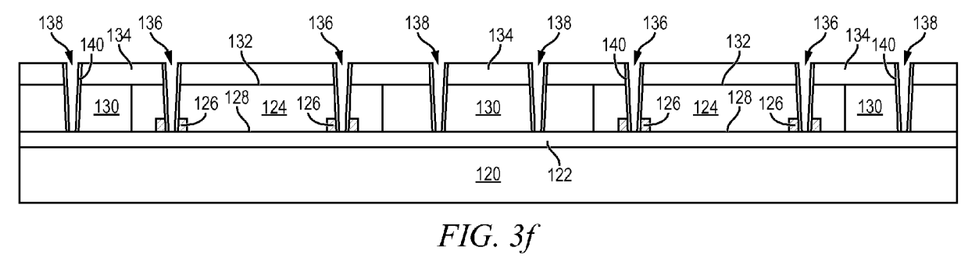

An optional insulating or dielectric layer 140 can be formed on the sidewalls of vias 136 and 138 using PVD, CVD, or thermal oxidation process. The insulating layer 140 can be one or more layers of SiO2, Si3N4, SiON, Ta2O5, Al2O3, polyimide, benzocyclobutene (BCB), polybenzoxazoles (PBO), or other suitable dielectric material. The remaining description continues without optional insulating layer 140.

Figure 3G:
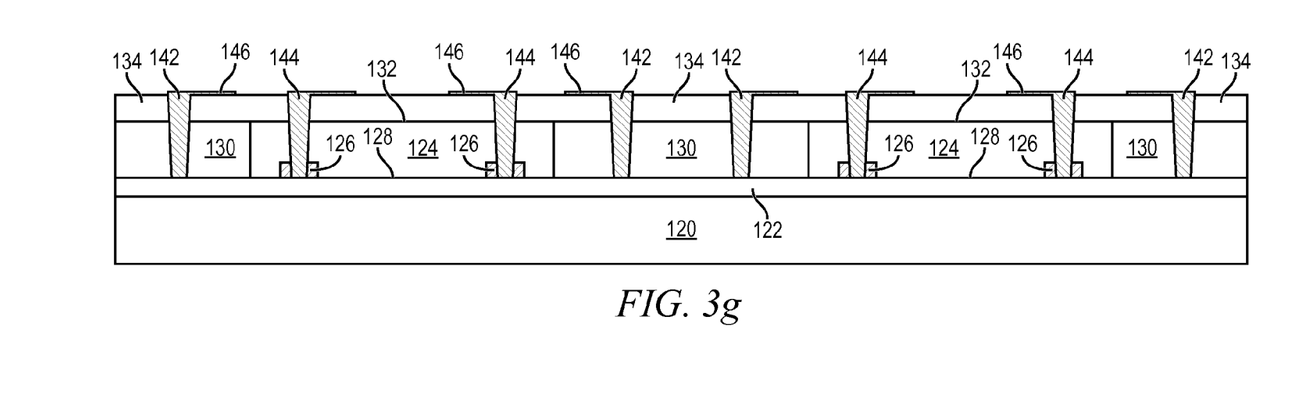

In FIG. 3g, the vias 138 are filled with Al, Cu, Sn, Ni, Au, Ag, titanium (Ti), W, poly-silicon, or other suitable electrically conductive material using electrolytic plating, electroless plating process, or other suitable metal deposition process to form conductive through mold vias (TMV) 142. The vias 136 are filled with Al, Cu, Sn, Ni, Au, Ag, Ti, W, poly-silicon, or other suitable electrically conductive material using electrolytic plating, electroless plating process, or other suitable metal deposition process to form conductive through silicon vias (TSV) 144. TSVs 144 are electrically connected to contact pads 126.

An electrically conductive layer 146 is formed over insulating layer 134, TMVs 142, and TSVs 144 using patterning and PVD, CVD, electrolytic plating, electroless plating process, or other suitable metal deposition process. Conductive layer 146 can be one or more layers of Al, Cu, Sn, Ni, Au, Ag, or other suitable electrically conductive material. The individual portions of conductive layer 146 are electrically connected to TMVs 142 and TSVs 144 and operate as a redistribution layer (RDL) to extend the electrical connectivity for the TMVs and TSVs.

Figure 3H:
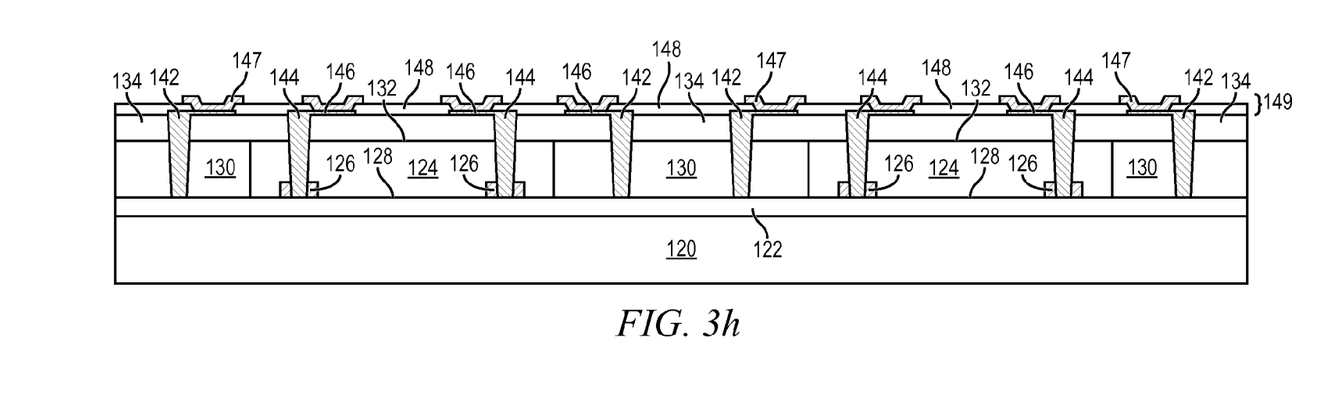

In FIG. 3h, a photoresist layer 148 is deposited and patterned over insulating layer 134 and conductive layer 146. A portion of photoresist layer 148 is removed to expose conductive layer 146. An optional conductive layer 147 is formed over conductive layer 146 using patterning and PVD, CVD, electrolytic plating, electroless plating process, or other suitable metal deposition process. Conductive layer 147 can be one or more layers of Al, Cu, Sn, Ni, Au, Ag, or other suitable electrically conductive material. Conductive layer 147 forms a multi-layer under bump metallization (UBM) including a barrier layer and adhesion layer. In one embodiment, the barrier layer contains Ni, titanium tungsten (TiW), chromium copper (CrCu), nickel vanadium (NiV), platinum (Pt), or palladium (Pd). The adhesion layer contains Al, titanium (Ti), chromium (Cr), or titanium nitride (TiN). UBM 147 provides a low resistive interconnect, as well as a barrier to Cu or solder diffusion. Alternatively, wire-bondable pads may also be formed over conductive layer 146. Conductive layer 146, photoresist layer 148, and UBM 147 constitute a build-up interconnect structure 149.

Figure 3I:
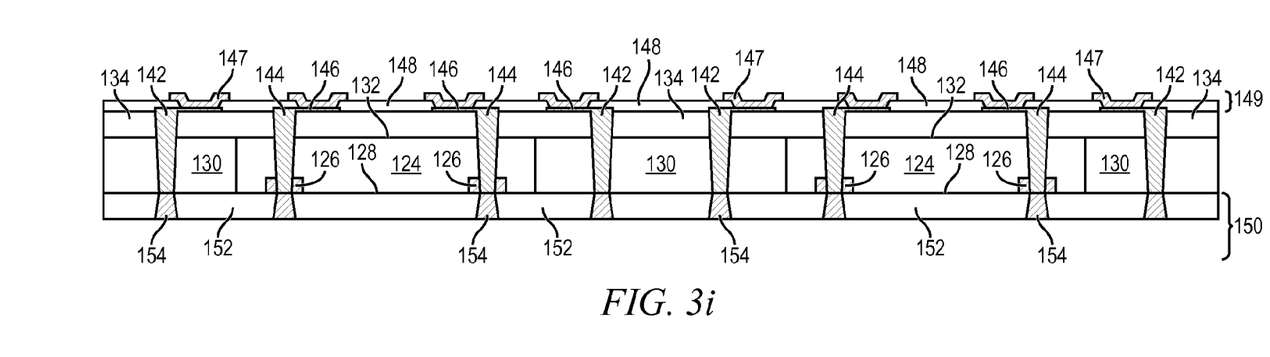

In FIG. 3i, carrier 120 and interface layer 122 are removed by chemical etching, mechanical peel-off, CMP, mechanical grinding, thermal bake, laser scanning, or wet stripping. A build-up interconnect structure 150 is formed over active surface 128 and encapsulant 130. The build-up interconnect structure 150 includes an insulating or passivation layer 152 formed by PVD, CVD, printing, spin coating, spray coating, or thermal oxidation. The insulating layer 152 can be one or more layers of SiO2, Si3N4, SiON, Ta2O5, Al2O3, or other material having similar insulating and structural properties. A portion of insulating layer 152 is removed by an etching process to expose TMVs 142 and TSVs 144. An electrically conductive layer 154 is formed in the removed portion of insulating layer 152 using patterning and PVD, CVD, electrolytic plating, electroless plating process, or other suitable metal deposition process. Conductive layer 154 can be one or more layers of Al, Cu, Sn, Ni, Au, Ag, or other suitable electrically conductive material. The individual portions of conductive layer 154 are electrically connected to TMVs 142 and TSVs 144.

Figure 3J:
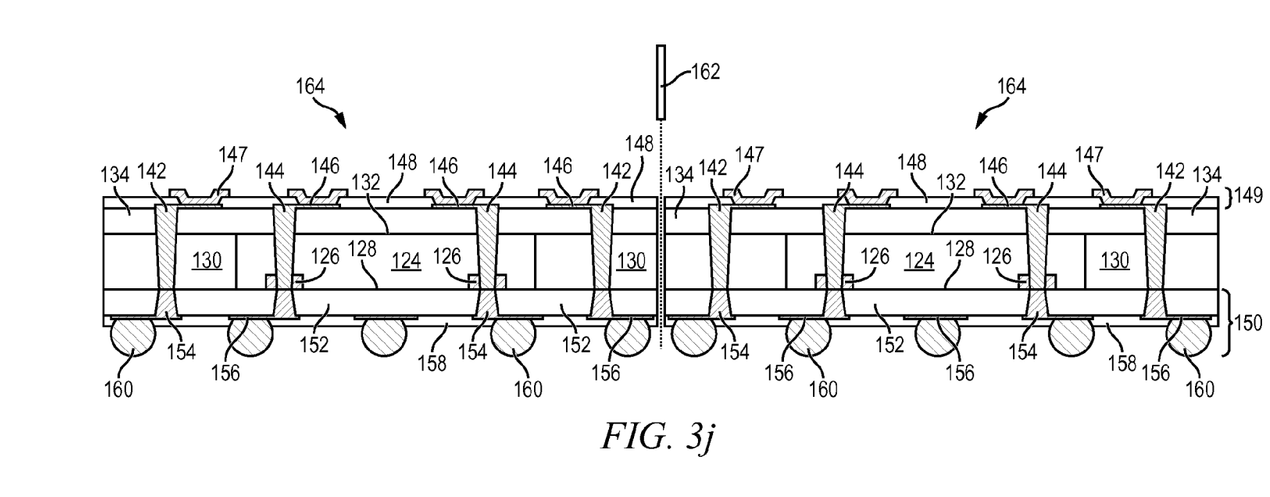

In FIG. 3j, the build-up interconnect structure 150 further includes an electrically conductive layer 156 formed over insulating layer 152 and conductive layer 154 using patterning and PVD, CVD, electrolytic plating, electroless plating process, or other suitable metal deposition process. Conductive layer 156 can be one or more layers of Al, Cu, Sn, Ni, Au, Ag, or other suitable electrically conductive material. The individual portions of conductive layer 156 are electrically connected to TMVs 142 and TSVs 144 and operate as an RDL to extend the electrical connectivity for the TMVs and TSVs.

An insulating or passivation layer 158 is formed over insulating layer 152 and conductive layer 156 by PVD, CVD, printing, spin coating, spray coating, or thermal oxidation. The insulating layer 158 can be one or more layers of SiO2, Si3N4, SiON, Ta2O5, Al2O3, or other material having similar insulating and structural properties. A portion of insulating layer 158 is removed by an etching process to expose conductive layer 156.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 160. In some applications, bumps 160 are reflowed a second time to improve electrical contact to conductive layer 156. The bumps can also be compression bonded to conductive layer 156. Bumps 160 represent one type of interconnect structure that can be formed over conductive layer 156. The interconnect structure can also use bond wires, conductive paste, stud bump, micro bump, or other electrical interconnect.

Figure 4:
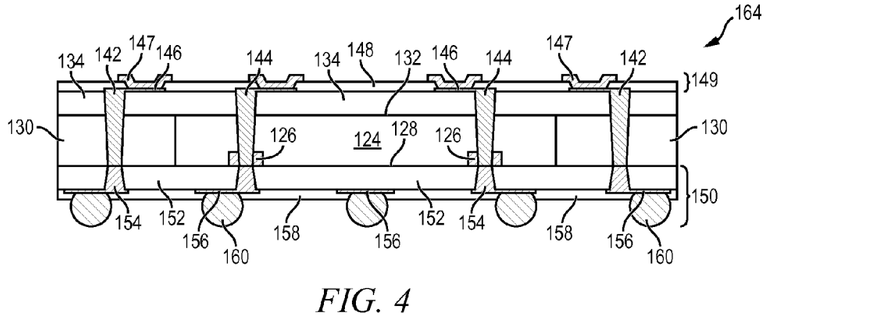
FIG. 4 illustrates the stackable WLCSP with TMVs and TSVs.

Semiconductor die 124 are singulated with saw blade or laser cutting device 162 into individual stackable WLCSP 164. FIG. 4 shows WLCSP 164 after singulation. Build-up interconnect structure 149 is electrically connected to contact pads 126 of semiconductor die 124 and conductive layers 154 and 156 of build-up interconnect structure 150 through conductive TMVs 142 and TSVs 144. TMVs 142 and TSVs 144 are formed from the same side during the same manufacturing process after depositing encapsulant 130. Since TSV 144 is formed after encapsulation, the same carrier 120 is used to form both TMVs 142 and TSVs 144. The separate manufacturing processes and different carriers noted in the background are no longer necessary. In addition, the formation of vias in the passivation layer over the TSVs mandated in the prior art can be avoided. The vias 136 used to form TSVs 144 extend through passivation layer 134, thus saving a process step required in the prior art. The continuous structure of TMVs 142 and TSVs 144 reduces contact resistance, increases conductivity, and improves signal integrity. Accordingly, forming TMVs 142 and TSV 144 from the same side during the same manufacturing process using the same carrier 120 simplifies the manufacturing, reduces cost, and reduces risk of defects. The formation of TSVs 144 after mounting semiconductor die 124 to carrier 120 and after depositing encapsulant 130 reduces device failures due to TSV formation defects in the wafer level.

Figure 5:
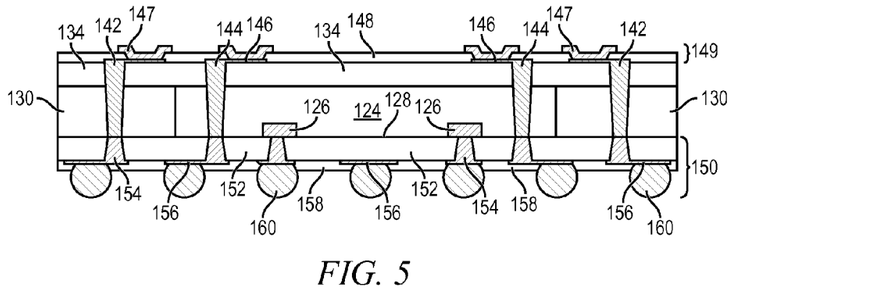
FIG. 5 illustrates the TSVs electrically connected to the active surface of the die.

FIG. 5 shows an embodiment similar to FIG. 4 with TSVs 144 electrically connected to circuit nodes within active surface 128 to provide additional vertical (z-direction) interconnect to increase input/output (I/O) count and density to upper stacked semiconductor devices. TSVs 144 are also electrically connected to portions of conductive layer 154 and conductive layer 156. Other portions of conductive layer 156 and conductive layer 154 are electrically connected to contact pads 126.

Figure 6:
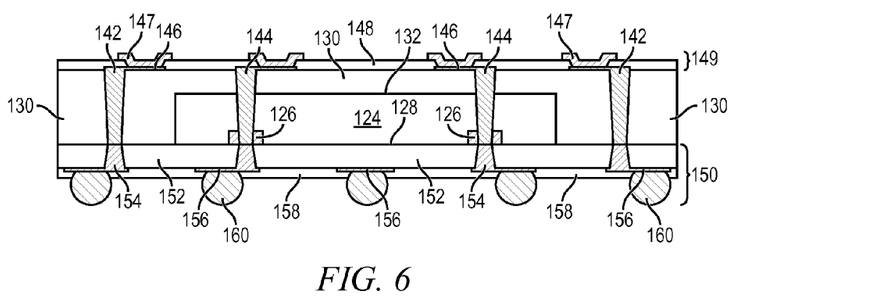
FIG. 6 illustrates the encapsulant covering the back surface of the semiconductor die.

FIG. 6 shows an embodiment similar to FIG. 4 with encapsulant 130 covering back surface 132 of semiconductor die 124. The insulating layer 134 described in FIG. 3d can be omitted as encapsulant 130 provides electrical and structural isolation.

Figure 7:
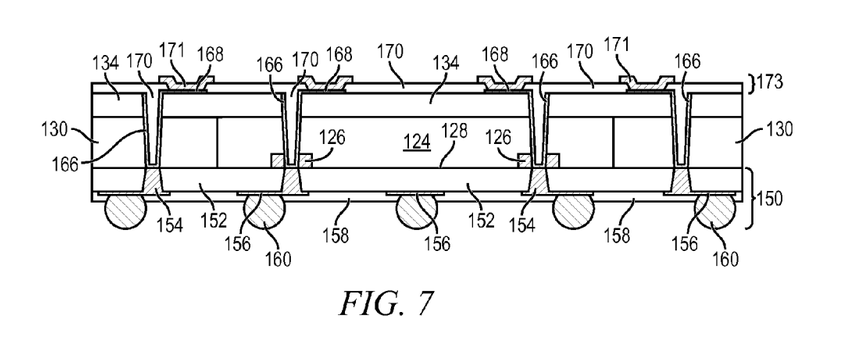
FIG. 7 illustrates the TMVs and TSVs conformally formed in the vias and then filled with photoresist material.

FIG. 7 shows an embodiment continuing from FIG. 3f with conductive layer 166 conformally formed on the sidewalls of vias 136 and 138, without completely filling the vias, using patterning and electrolytic plating, electroless plating process, or other suitable metal deposition process. Conductive layer 166 can be one or more layers of Al, Cu, Sn, Ni, Au, Ag, or other suitable electrically conductive material.

An electrically conductive layer 168 is formed over insulating layer 134 using patterning and PVD, CVD, electrolytic plating, electroless plating process, or other suitable metal deposition process. Conductive layer 168 can be one or more layers of Al, Cu, Sn, Ni, Au, Ag, or other suitable electrically conductive material. Conductive layer 168 is electrically connected to conductive layer 166 formed in vias 136 and 138 and operates as an RDL to extend the electrical connectivity for the TMVs and TSVs.

A photoresist or insulating layer 170 is deposited and patterned over insulating layer 134 and conductive layer 168. Photoresist 170 fills the remaining area of vias 136 and 138 over conductive layer 166. A portion of photoresist layer 170 is removed to expose conductive layer 168. An optional UBM 171 is formed over conductive layer 168. Conductive layer 168, photoresist layer 170, and UBM 171 constitute a build-up interconnect structure 173. The remainder of the process follows FIG. 3g-3j.

Figure 8:
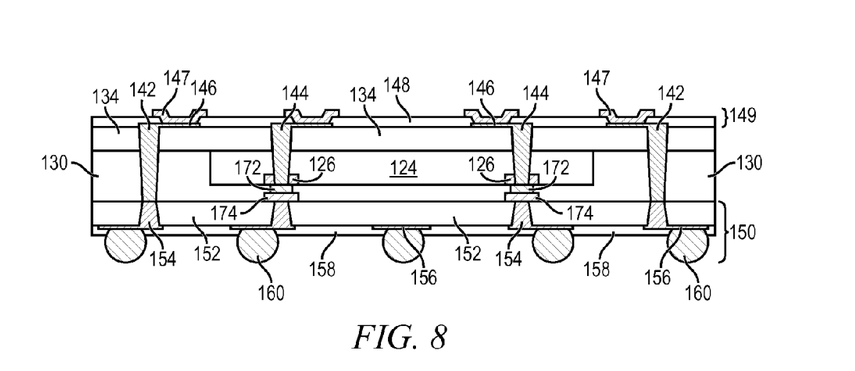
FIG. 8 illustrates bumped semiconductor die mounted to contact pads on the carrier.

FIG. 8 shows an embodiment similar to FIG. 4 with bumps 172 formed on contact pads 126, and contact pads 174 formed on carrier 120, prior to mounting semiconductor die 124 to carrier 120. Semiconductor die 124 with bumps 172 is mounted to contact pads 174. Contact pads 174 are electrically connected to conductive layer 154. Bumps 172 provide finer interconnect pitch and increases I/O density. Encapsulant 130 underfills semiconductor die 124.

Figure 9:
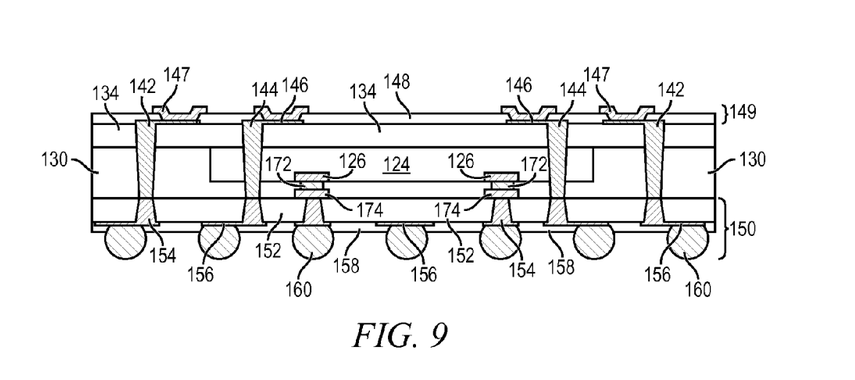
FIG. 9 illustrates bumped semiconductor die mounted to contact pads on the carrier and the TSVs electrically connected to the active surface of the die.

FIG. 9 shows an embodiment similar to FIG. 8 with TSVs 144 electrically connected to circuit nodes within active surface 128 to provide additional vertical (z-direction) interconnect to increase I/O count and density to upper stacked semiconductor devices. TSVs 144 extend through encapsulant 130 to electrically connect to portions of conductive layer 154 and conductive layer 156. Other portions of conductive layer 156 and conductive layer 154 are electrically connected to bumps 172 and contact pads 126 and 174.

Figure 10:
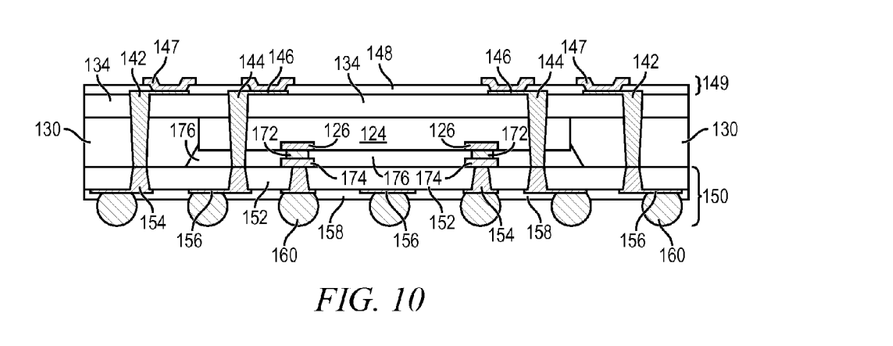
FIG. 10 illustrates bumped semiconductor die mounted to contact pads on the carrier with underfill material.

FIG. 10 shows an embodiment similar to FIG. 9 with an underfill material 176, such as epoxy resin, deposited under semiconductor die 124. TSVs 144 are electrically connected to circuit nodes within active surface 128 to provide additional vertical (z-direction) interconnect to increase I/O count and density to upper stacked semiconductor devices. TSVs 144 extend through underfill material 176 to electrically connect to portions of conductive layer 154 and conductive layer 156. Other portions of conductive layer 156 and conductive layer 154 are electrically connected to contact pads 126.

Figure 11:
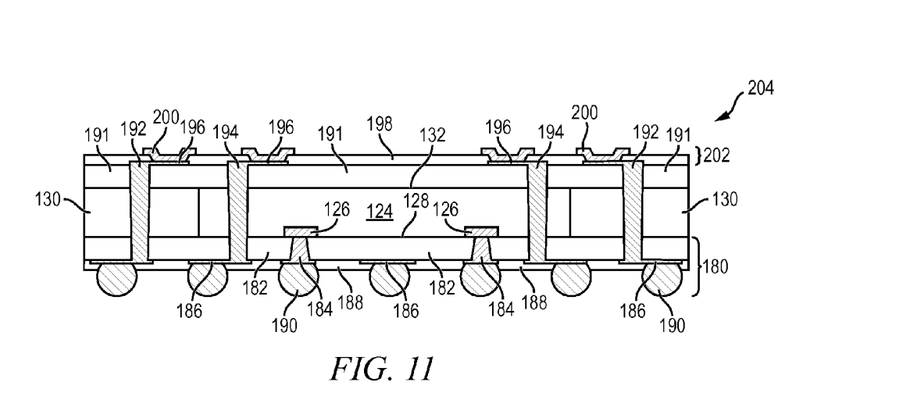
FIG. 11 illustrates using the lower build-up interconnect structure as support to form the TMVs and TSVs during the same manufacturing process in the same direction.

FIG. 11 shows an embodiment continuing from FIG. 3c with carrier 120 and interface layer 122 removed by chemical etching, mechanical peel-off, CMP, mechanical grinding, thermal bake, laser scanning, or wet stripping. A build-up interconnect structure 180 is formed over active surface 128 and encapsulant 130. The build-up interconnect structure 180 includes an insulating or passivation layer 182 formed by PVD, CVD, printing, spin coating, spray coating, or thermal oxidation. The insulating layer 182 can be one or more layers of SiO2, Si3N4, SiON, Ta2O5, Al2O3, or other material having similar insulating and structural properties. A portion of insulating layer 182 is removed by an etching process to expose contact pads 126. An electrically conductive layer 184 is formed in the removed portion of insulating layer 182 using patterning and PVD, CVD, electrolytic plating, electroless plating process, or other suitable metal deposition process. Conductive layer 184 can be one or more layers of Al, Cu, Sn, Ni, Au, Ag, or other suitable electrically conductive material. Conductive layer 184 is electrically connected to contact pads 126.

An electrically conductive layer 186 is formed over insulating layer 182 using patterning and PVD, CVD, electrolytic plating, electroless plating process, or other suitable metal deposition process. Conductive layer 186 can be one or more layers of Al, Cu, Sn, Ni, Au, Ag, or other suitable electrically conductive material. The individual portions of conductive layer 186 operate as an RDL to extend the electrical connectivity.

An insulating or passivation layer 188 formed over insulating layer 182 and conductive layer 186 by PVD, CVD, printing, spin coating, spray coating, or thermal oxidation. The insulating layer 188 can be one or more layers of SiO2, Si3N4, SiON, Ta2O5, Al2O3, or other material having similar insulating and structural properties. A portion of insulating layer 188 is removed by an etching process to expose conductive layer 186.

An electrically conductive bump material is deposited over conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 190. In some applications, bumps 190 are reflowed a second time to improve electrical contact to conductive layer 186. The bumps can also be compression bonded to conductive layer 186. Bumps 190 represent one type of interconnect structure that can be formed over conductive layer 186. The interconnect structure can also use bond wires, conductive paste, stud bump, micro bump, or other electrical interconnect.

An insulating or passivation layer 191 is formed over back surface 132 of semiconductor die 124 and encapsulant 130 using PVD, CVD, printing, spin coating, spray coating, or thermal oxidation process. The insulating layer 191 can be one or more layers of SiO2, Si3N4, SiON, Ta2O5, Al2O3, or other material having similar insulating and structural properties.

A plurality of vias is formed through insulating layer 191 and semiconductor die 124 and insulating layer 182 using laser drilling, mechanical drilling, or DRIE, similar to FIG. 3e. The vias are formed after depositing encapsulant 130 with active surface 128 of semiconductor die 124 facing down. The vias extend through insulating layer 191 and the silicon region of semiconductor die 124 and insulating layer 182 to conductive layer 186. Likewise, a plurality of vias is formed through insulating layer 191 and encapsulant 130 and insulating layer 182 using laser drilling, mechanical drilling, or DRIE, similar to FIG. 3f. The vias are formed from the same side and extend to conductive layer 186. The vias are formed simultaneously or consecutively from the same side during the same manufacturing process using the same carrier 120.

An optional insulating or dielectric layer can be formed on the sidewalls of the vias using PVD, CVD, or thermal oxidation process. The insulating layer can be one or more layers of SiO2, Si3N4, SiON, Ta2O5, Al2O3, polyimide, BCB, PBO, or other suitable dielectric material.

The vias through encapsulant 130 are filled with Al, Cu, Sn, Ni, Au, Ag, Ti, W, poly-silicon, or other suitable electrically conductive material using electrolytic plating, electroless plating process, or other suitable metal deposition process to form conductive TMVs 192. TMVs 192 are electrically connected to portions of conductive layer 186. The vias through semiconductor die 124 are filled with Al, Cu, Sn, Ni, Au, Ag, Ti, W, poly-silicon, or other suitable electrically conductive material using electrolytic plating, electroless plating process, or other suitable metal deposition process to form conductive TSVs 194. TSVs 194 are electrically connected to other portions of conductive layer 186.

An electrically conductive layer 196 is formed over insulating layer 191, TMVs 192, and TSVs 194 using patterning and PVD, CVD, electrolytic plating, electroless plating process, or other suitable metal deposition process. Conductive layer 196 can be one or more layers of Al, Cu, Sn, Ni, Au, Ag, or other suitable electrically conductive material. Conductive layer 196 is electrically connected to TMVs 192 and TSVs 194 and operates as an RDL to extend the electrical connectivity for the TMVs and TSVs.

A photoresist layer 198 is deposited and patterned over insulating layer 191 and conductive layer 196. A portion of photoresist layer 198 is removed to expose conductive layer 196. An optional conductive layer 200 is formed over conductive layer 198 using patterning and PVD, CVD, electrolytic plating, electroless plating process, or other suitable metal deposition process. Conductive layer 200 can be one or more layers of Al, Cu, Sn, Ni, Au, Ag, or other suitable electrically conductive material. Conductive layer 200 forms a multi-layer UBM including a barrier layer and adhesion layer. In one embodiment, the barrier layer contains Ni, TiW, CrCu, NiV, Pt, or Pd. The adhesion layer contains Al, Ti, Cr, or TiN. UBM 200 provides a low resistive interconnect, as well as a barrier to Cu or solder diffusion. Alternatively, wire-bondable pads may also be formed over conductive layer 196. Conductive layer 196, photoresist layer 198, and UBM 200 constitute a build-up interconnect structure 202.

In WLCSP 204, build-up interconnect structure 202 is electrically connected to contact pads 126 of semiconductor die 124 and conductive layers 184 and 186 of build-up interconnect structure 180 through conductive TMVs 192 and TSVs 194. TMVs 192 and TSVs 194 are formed from the same side during the same manufacturing process after depositing encapsulant 130. Since TSV 194 is formed after encapsulation, the same support structure, i.e., build-up interconnect structure 180, is used to form both TMVs 192 and TSVs 194. The separate manufacturing processes and different carriers noted in the background are no longer necessary. In addition, the formation of vias in the passivation layer over TSVs mandated in the prior art can be avoided. The vias used to form TSVs 194 extend through passivation layer 191, thus saving a process step required in the prior art. The continuous structure of TMVs 192 and TSVs 194 reduces contact resistance, increases conductivity, and improves signal integrity. Accordingly, forming TMVs 192 and TSV 194 from the same side during the same manufacturing process using the same support structure simplifies the manufacturing, reduces cost, and reduces risk of defects. The formation of TSVs 194 after mounting semiconductor die 124 to carrier 120 and after depositing encapsulant 130 reduces device failures due to TSV formation defects in the wafer level.

Figure 12:
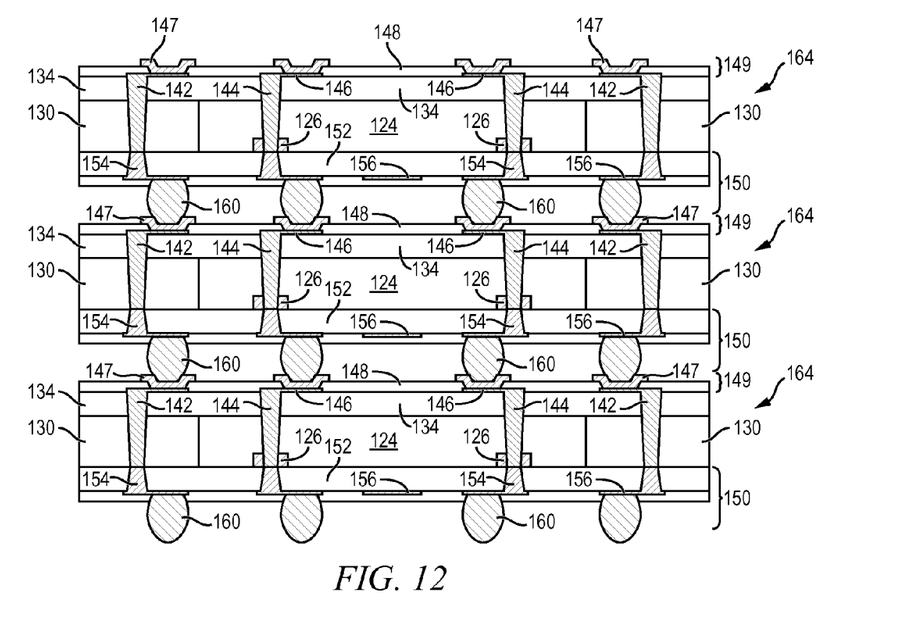
FIG. 12 illustrates stacked WLCSP interconnected by the TMVs, TSVs, and interconnect structures.

FIG. 12 shows stacked WLCSP 164 from FIG. 4 electrically interconnected in the z-direction by conductive layer 146, UBM 147, TMVs 142, TSVs 144, bumps 160, and conductive layers 154 and 156 of build-up interconnect structure 150.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die;
an encapsulant deposited around the semiconductor die;
an insulating layer formed over the semiconductor die;
a first conductive via including a continuous linear sidewall extending through the insulating layer and semiconductor die; and
a second conductive via formed through the encapsulant.

2. The semiconductor device of claim 1, further including a first interconnect structure formed over the insulating layer.

3. The semiconductor device of claim 2, further including a second interconnect structure formed over the semiconductor die opposite the first interconnect structure.

4. The semiconductor device of claim 1, wherein the encapsulant is planar with a surface of the semiconductor die.

5. The semiconductor device of claim 1, further including an insulating material disposed within the first conductive via or second conductive via.

6. The semiconductor device of claim 1, further including an insulating material disposed over the continuous linear sidewall of the first conductive via or a sidewall of the second conductive via.

7. A semiconductor device, comprising:
a semiconductor die;
a first insulating material deposited over and around the semiconductor die;
a first conductive via including a linear sidewall extending through the first insulating material and semiconductor die; and
a second conductive via formed through the first insulating material.

8. The semiconductor device of claim 7, further including a first interconnect structure formed over the first insulating material.

9. The semiconductor device of claim 8, further including a second interconnect structure formed over the semiconductor die opposite the first interconnect structure.

10. The semiconductor device of claim 7, further including a second insulating material disposed within the first conductive via or second conductive via.

11. The semiconductor device of claim 7, further including a second insulating material disposed over the linear sidewall of the first conductive via or a sidewall of the second conductive via.

12. The semiconductor device of claim 7, further including a bump formed over the semiconductor die.

13. The semiconductor device of claim 7, further including a plurality of stacked semiconductor devices electrically connected through the first conductive via and second conductive via.

14. A semiconductor device, comprising:
a semiconductor die;
a first insulating material deposited over and around the semiconductor die;
a first interconnect structure formed over the semiconductor die; and
a first conductive via extending through the first insulating material, semiconductor die, and first interconnect structure.

15. The semiconductor device of claim 14, further including a second conductive via formed through the first insulating material.

16. The semiconductor device of claim 14, further including a second interconnect structure opposite the first interconnect structure.

17. The semiconductor device of claim 14, further including a second insulating material disposed within the first conductive via.

18. The semiconductor device of claim 14, further including a second insulating material disposed over a sidewall of the first conductive via.

19. The semiconductor device of claim 14, further including a plurality of stacked semiconductor devices electrically connected through the first interconnect structure and first conductive via.

20. A semiconductor device, comprising:
a semiconductor die;
a first insulating material deposited over and around the semiconductor die; and
a first conductive via including a continuous sidewall extending through the first insulating material and semiconductor die.

21. The semiconductor device of claim 20, further including a first interconnect structure formed over the first insulating material.

22. The semiconductor device of claim 21, further including a second interconnect structure formed over the semiconductor die opposite the first interconnect structure.

23. The semiconductor device of claim 20, further including a second insulating material disposed within the first conductive via.

24. The semiconductor device of claim 20, further including a second insulating material disposed over the continuous sidewall of the first conductive via.

25. The semiconductor device of claim 20, further including a plurality of stacked semiconductor devices electrically connected through the first conductive via.

* * * * *